Aug. 19, 1958 D. G. SCORGIE 2,848,563

DIELECTRIC AMPLIFIER

Filed April 29, 1954 2 Sheets-Sheet 1

INVENTOR
DONALD G. SCORGIE

BY D. G. Snyder
Howard White
ATTORNEYS

INVENTOR
DONALD G. SCORGIE

BY *D. S. Snyder*
*Edward White* ATTORNEYS 2,848,563

DIELECTRIC AMPLIFIER

Donald G. Scorgie, Forestville, Md.

Application April 29, 1954, Serial No. 426,612

1 Claim. (Cl. 179—171)

(Granted under Title 35, U. S. Code (1952), sec. 266)

The invention described herein may be manufactured and used by or for the Government of the United States of America for governmental purposes without the payment of any royalties thereon or therefor.

This invention pertains to voltage and power amplifiers and more particularly to dielectric-type voltage and power amplifiers using non-linear capacitors to obtain amplification or control.

Dielectric amplifiers commonly in use until now have utilized a non-linear capacitor to couple a supply voltage to an output circuit, wherein a relatively small amplitude signal voltage connected across the capacitor varies the capacitance and impedance thereof, to control the output voltage therefrom. The ratio of output voltage variation to signal voltage variation represents the voltage amplification effected by the arrangement. Typical prior art devices of this general type are to be found in the article "Dielectric Amplifiers I" by G. W. Penney et al., appearing as A. I. E. E. Technical Paper 53-130 (1952).

The dielectric amplifiers used heretofore generally have been power amplifiers and for many applications they suffer from the disadvantage that they afford very little voltage gain. Additionally, the speed of response of the prior art devices is at best of the order of 4 or 5 cycles at the supply frequency. In many applications of such amplifiers, particularly in industrial control circuits, speed of response is very important and the long response times obtainable with devices used heretofore often have been intolerable.

Another limitation of prior art dielectric amplifiers has been their low cut-off frequency. The amplifier gain falls off very rapidly when the control frequency approaches to ¼ to ½ of the supply frequency; often the maximum ratio of control frequency to supply frequency is considerably lower.

Accordingly, one object of the persent invention is to provide a dielectric type amplifier capable of relatively high voltage and power gain.

Another object is to provide a dielectric amplifier having a half cycle response time at the supply frequency thereof.

A further object is to provide a dielectric amplifier having a substantial power gain when the signal frequency thereof is the same as the supply frequency.

Other objects and features of the present invention will become apparent upon consideration of the following detailed description when taken in connection with the accompanying drawings which illustrate various embodiments of the invention. It is to be expressly understood, however, that the drawings are designed for purposes of illustration only and are not intended as a definition of the limits of the invention; reference for the latter purpose is to be had to the appended claims.

Figures 1, 1A:
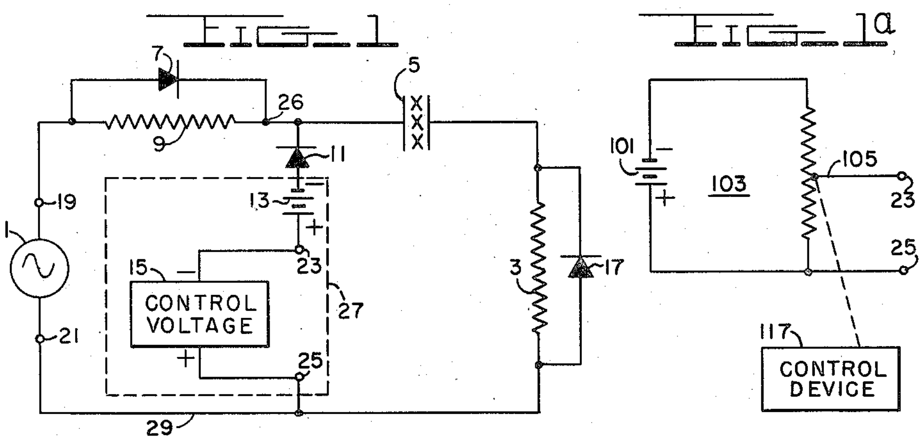

Figures 1 and 1*a* are schematic diagrams of one embodiment of my invention.

Figure 2A:
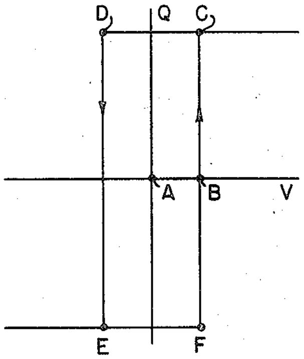
Figure 2B:
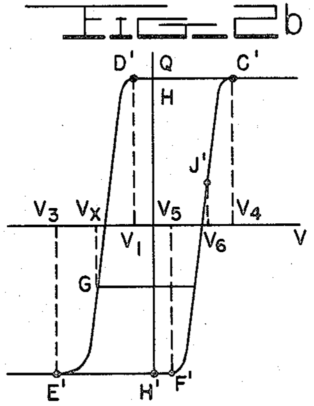

Figures 2*a* and 2*b* respectively illustrate the idealized and actual curves of the variation of charge as a function of voltage of a non-linear capacitor utilized in my invention.

Figure 3:
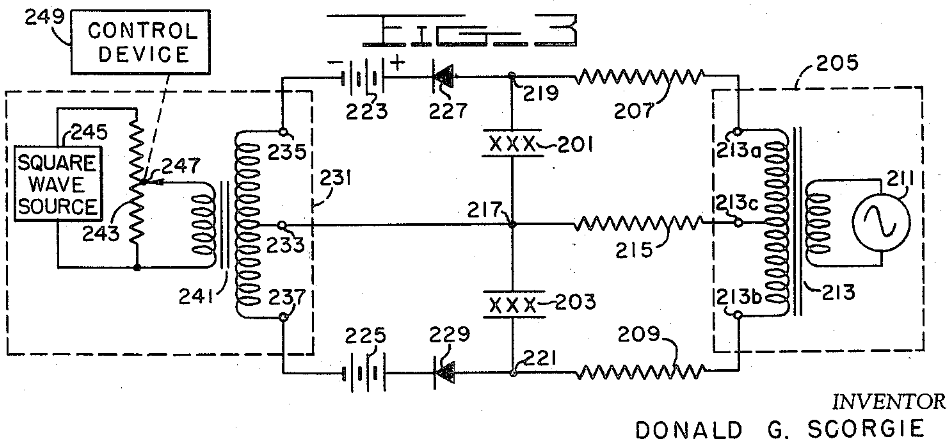

Figure 3 is a schematic diagram of another embodiment of my invention.

Figure 4:
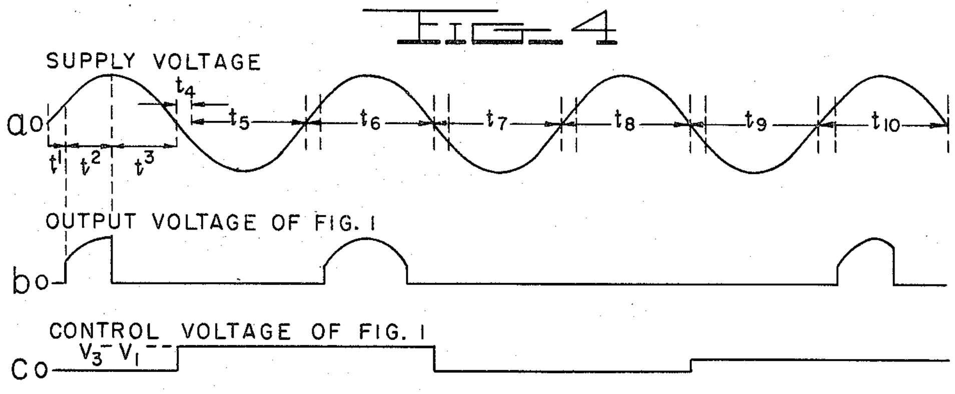

Figure 4, which includes parts *a*, *b*, and *c*, shows waveform representations of the supply voltage, output voltage and control voltage respectively of the embodiment of Figure 1.

Figures 5, 6:
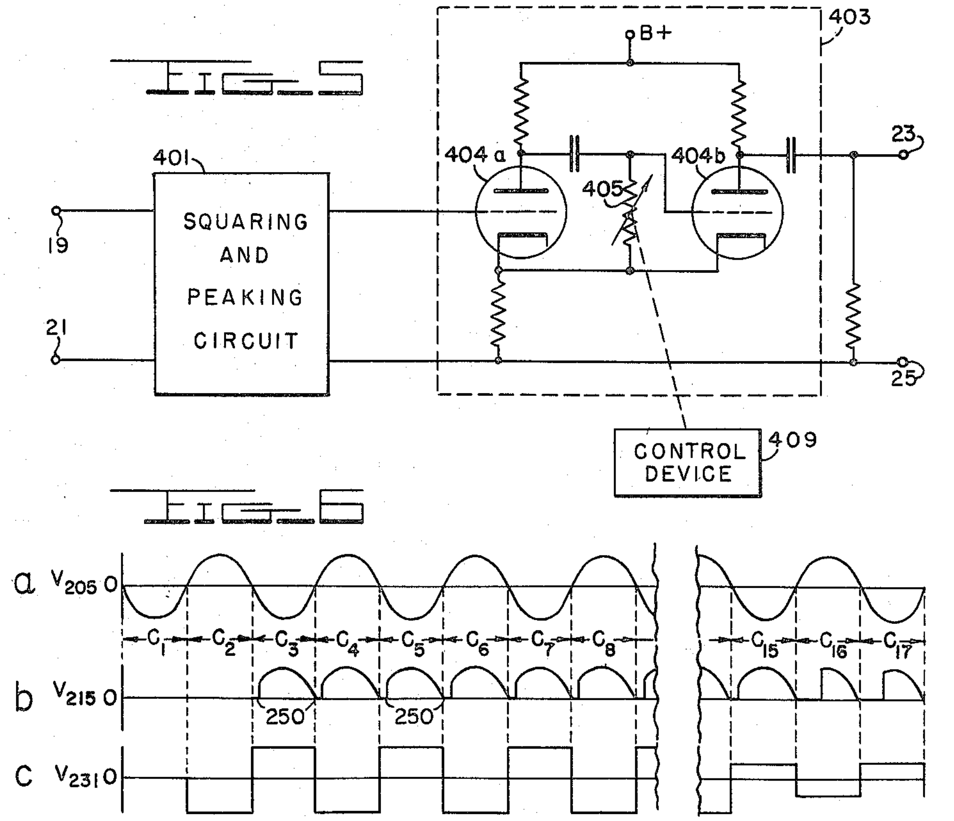

Figure 5 is a diagrammatic representation of a control voltage source suitable for use with the embodiment of Figure 1.

Figure 6, which includes parts *a*, *b* and *c*, shows waveform representation of the supply voltage, the output voltage and the control voltage of the embodiment in Figure 3, plotted as a function of time.

The non-linear capacitors used in my invention are conventional and are preferably of the so-called "rectangular loop" dielectric type making use of materials such as the barium titanates and barium stannates. In practice the rectangular loop characteristic is obtained by a forming treatment which entails subjecting the dielectric to several heating cycles with no electric field thereacross.

The variation of charge as a function of applied voltage for such capacitors is illustrated in Figures 2*a* and 2*b*. Capacitors utilizing dielectrics such as barium titanate possess a saturating charge characteristic in that they will not take on a charge from an applied voltage until the voltage across the capacitor is of a given critical value. Then when the voltage reaches this critical value as represented at point B of Figure 2*a*, the capacitor will suddenly be charged to a saturation level as at point C. As the voltage is further increased, little or no additional charge will be taken by the capacitor. Thereafter the charge absorbed by the capacitor will be retained therein until the voltage thereacross is of the reverse polarity. When the reverse-polarity voltage reaches a given value, as at point D, the capacitor will proceed to charge saturation in the opposite direction, as is depicted at point E. Thus an alternating voltage whose peak value exceeds the critical value will when applied across the condenser alternately drive the capacitor to saturation first in one sense toward C and then in the opposite sense toward E, which phenomenon will be recognized as being similar to the familiar hysteresis effect of magnetic materials.

The dielectric constant of such capacitors varies with temperature and reaches a maximum at a point in its temperature characteristic known as the Curie point. In the ensuing discussion it will be assumed that the capacitors in the circuit to be described are operating at temperatures below the Curie point being maintained thereat by means of a temperature control system if necesary. It has been found that the rectangular loop characteristics of the capacitors are much more pronounced and the hysteresis losses are much greater when the capacitors are operated below the Curie point than when they are operated above the Curie point.

Briefly, in my invention I utilize a saturable, non-linear capacitor as a gating element through which an alternating supply voltage is coupled to a load in accordance with the amplitude of a control signal coupled to the capacitor. Such a non-linear capacitor will couple an alternating voltage supply source to a load during a given half cycle of the supply voltage in dependence upon the condition of the charge on the condenser at the beginning of the given half cycle. For example, assume that the source will tend to drive the capacitor toward saturation in a given sense during that given half cycle and that the capacitor is already saturated in the given sense at the beginning of the half cycle, then the capacitor will behave as an open circuit and will effectively decouple the source from the load. Only if the capacitor is saturated in the opposite sense or charged to an intermediate value between the saturation levels, will the output of the source appear across the load as the capacitor is driven to saturation. As soon as saturation is reached, the load will be decoupled from the supply source, and the voltage across the load will drop to zero. Therefore, by selectively withdrawing the capacitor from saturation on the half cycle immediately preceding the given half cycle, or preventing the capacitor from being so withdrawn, varying amounts of power can be selectively coupled to the load during the given half cycle.

As has been explained, a saturable, non-linear capacitor will be withdrawn from saturation only if the voltage thereacross exceeds a given critical value. Consequently by limiting the withdrawing voltage across the capacitor to a value equal to or less than the critical value, the capacitor will be prevented from being withdrawn from saturation by the supply source. Only when the control voltage exceeds the critical value can the capacitor be withdrawn from saturation. Therefore, the amplitude of the control voltage on the half cycle immediately preceding a given half cycle will determine whether or not the supply source is coupled to the load during the given half cycle.

With reference now to Figure 1, there is shown one embodiment of my invention. Therein is shown an alternating voltage supply source 1 having terminals 19 and 21. The function of this source is to supply power and voltage to load 3, which power and voltage may be an ordinary 115 volt, 60 cycle, sinusoidal alternating voltage generator such as is used in power distribution applications, but it is not limited to this type of device. It may have any frequency from low audio (1 or 2 C. P. S.) to radio-frequency, and the voltage output of the supply source is limited only by the breakdown voltage of the other components in the circuit to be described.

Source 1 is coupled to load 3 by means of a non-linear, saturable, dielectric capacitor 5 connected in series with a unilateral current limiting circuit comprising parallel-connected resistor 9 and halfwave rectifier 7. Load 3 is typically a high impedance, low current device such as a piezoelectric crystal used in sonar applications.

For reasons that will be made evident below, half wave rectifier 7 is polarized to oppose current flow from terminal 21 to terminal 19 in the circuit external to generator 1, and to short-circuit resistor 9 insofar as current flow from terminal 19 to terminal 21 is concerned. Rectifier 7 is conveniently a selenium rectifier capable of passing the current requirements of load 3.

As thus connected, source 1 operates to drive capacitor 5 to charge saturation and deliver power to load 3 during the half cycles that terminal 19 is positive relative to terminal 21, and to withdraw capacitor 5 from saturation during the intermediate half cycles. With the circuit thus far described, voltage source 1 acts to alternately drive the capacitor 5 to saturation first in one sense and then in the opposite sense thereby delivering full power to the load. To provide intermediate values of power to load 3, a halfwave voltage clamping circuit comprising series-connected halfwave rectifier 11 and voltage source 27 is connected between the common terminal 26 of capacitor 5, rectifier 7 and resistor 9, and the line 29 directly connecting terminal 21 to load 3. Additionally, halfwave rectifier 17 is coupled across load 3 and is polarized to pass current when terminal 21 is positive with respect to terminal 19. The function of rectifier 17 is to provide a low impedance path for connecting the clamping circuit directly across capacitor 5 and to short-circuit the load 3, when terminal 21 is at a positive polarity with respect to terminal 19.

Potential source 27 is shown as comprising a battery 13 connected in series addition with a variable control voltage source 15 having terminals 23 and 25. Both sources 13 and 15 are connected so as to oppose conduction in rectifier 11, and battery 13 is fixed at a potential slightly less than the critical potential required to withdraw capacitor 5 from saturation, whereby variable source 15 need only supply the small voltage required to withdraw capacitor 5 from one sense of saturation to the other.

Control voltage source 15 may conveniently be a pulse generator synchronized with supply source 1 such as is shown in Figure 5, or it may be an ordinary D. C. source such as is shown in Figure 1*a* wherein a battery or other conventional D. C. source 101 is connected to the terminals of a potentiometer 103. The tap 105 of this potentiometer is connected to terminal 23 (see Figure 1). If remote control is desired a servomotor 117 or the like may be coupled to tap 105 by a mechanical linkage and vary the position of the tap to determine the voltage between terminals 23 and 25.

Rectifier 11 together with source 27 functions to prevent the half cycle voltage of source 1 as it is developed across capacitor 5 from rising above that of source 27. Rectifier 11 like rectifier 17 is polarized to oppose current flow from terminal 19 to terminal 21; it can be readily seen that current can pass through control voltage source 27 and rectifier 11 only when terminal 21 is positive with respect to terminal 19. Inasmuch as this latter current is limited by resistor 9, source 27 may have a very low power capability.

The operation of the embodiment of Figure 1 will now be set forth with reference to Figure 2*a* and the waveform representations of Figure 4*a*. In the ensuing discussion, half cycles of the sinusoidal output voltage of supply source 1 over which terminal 19 is positive with respect to terminal 21 will be termed "forward" half cycles, and half cycles over which the voltage source 1 is of the opposite polarity will be termed "reset" half cycles. Furthermore, the capacitor will be referred to as being driven toward saturation in a positive sense on forward half cycles and toward saturation in a negative sense on reset half cycles.

It will first be assumed that capacitor 5 is initially uncharged (i. e., in the condition represented by point A of Figure 2*a*) and that the output voltage of supply source 1 is at the beginning of a forward half cycle (at the beginning of interval $t_1$ in Figure 4*a*). During this half cycle rectifier 7 conducts thus by-passing current limiting resistance 9 and rectifiers 11 and 17 are blocked. Over the time interval $t_1$, the supply voltage source 1 will have no effect on capacitor 5 because the voltage amplitude of the output thereof is insufficient to effect charging of the capacitor. At the end of interval $t_1$, capacitor 5 will begin charging, and the effective impedance thereof will suddenly drop to a very small value until saturation is reached at the end of interval $t_2$ as at point C (Figure 2*a*). During the interval $t_2$, the output voltage of supply source 1 will be coupled to load 3 through rectifier 7, and a voltage pulse of substantially the same amplitude as the output of the supply voltage during the interval $t_2$ will appear across load 3. At the end of the interval $t_2$ and for the remainder of the forward half cycle of supply 1, capacitor 5 will be saturated, whereupon supply source 1 will be decoupled from load 3, and the voltage across load 3 will drop to zero.

In addition to the above assumptions, let it further be assumed that the output voltage of control source 15 has been set at a value such that the total output of source 15 and 13 is greater than the voltage required to drive capacitor 5 to saturation in a negative sense. This setting corresponds to the full output condition. Thus during the portion of the next following half cycle over which the voltage output from source 1 is less than or equal to the total output potential of source 27, rectifier 11 will be blocked and the output of source 1 will appear across capacitor 5. Also during this half cycle and if source 1 exceeds the potential of source 27, rectifier 11 will continue to block so long as the voltage across capacitor 5 remains less than source 27. With rectifier 11 blocked, the source current will flow through capacitor 5, thereby withdrawing it from saturation. During time interval $t_4$ the output voltage of supply source 1 will have no effect on capacitor 5 until it reaches a value sufficient to withdraw the capacitor from saturation in a negative sense. Thereafter, during time interval $t_5$, capacitor 5 will be driven toward saturation in a negative direction. Rectifier 17 will act to short-circuit load 3, so that only current limiting resistance 9 is effective to limit the rate at which the capacitor 5 is withdrawn from saturation. The value of this resistance is preferably such that the charge on capacitor 5 reaches the "knee" of the charge curve depicted at E (Figure 2*a*) at a time very near the end of the reset half cycle. In practice resistor 9 may be chosen equal to load 3.

During the next forward half cycle of supply 1, $t_6$, capacitor 5 will again be driven to saturation in a positive sense, and a voltage pulse will appear across load 3 the time-integral of which is greater than the time-integral of the first voltage pulse appearing during interval $t_2$ due to the greater number of coulombs required to bring the capacitor from saturation in a negative sense to saturation in a positive sense than to bring it from zero to saturation in a positive sense. Thus referring to Figure 2*a*, in the first half cycle capacitor 5 was charged from point B to C while during $t_6$, it was charged from point F to C. The time-integral of voltage in a pulse appearing on a given forward half cycle is proportional to the extent to which capacitor 5 is withdrawn from saturation or saturated negatively during the reset half cycle, as will be explained more fully below with respect to Figures 2*b* and 5.

If the output of control voltage source 15 is dropped to zero (zero output condition) so that the total voltage output of source 27 is less than the voltage required to withdraw capacitor 5 from saturation in a positive sense, the following chain of events will occur. During period $t_7$ the reset half cycle, the voltage output of source 1 appearing across capacitor 5 will rise toward the critical negative value but only to a value equal to the output of clamping source 27. Thereupon, current will flow through source 27 and rectifier 11, and the voltage across capacitor 5 will remain at a level insufficient to effect withdrawal thereof from saturation so that at the end of the reset half cycle, capacitor 5 remains saturated in a positive sense. On the next forward half cycle of operation at period $t_8$ in Figure 4, the voltage across the load 3 will remain at substantially zero, because when capacitor 5 is in a saturated condition, it effectively decouples supply source 1 from the load 3 over the entire forward half cycle.

If on subsequent reset half cycles, the output of clamping source 27 is again adjusted to a value sufficient to allow withdrawal of the capacitor to saturation in a negative sense, then power will again be delivered to the load during the forward half cycles of source 1.

In practice it is virtually impossible to design a capacitor that will give a perfectly rectangular charge curve of the type ideally illustrated in Figure 2*a*, wherein the "knees" of the curve are extremely sharp, and the vertical sides are parallel to the charge coordinate. The difference in amplitude between the control voltage required from source 27 to start withdrawing the capacitor from saturation in one sense and the voltage required to complete saturation in the opposite sense will be found to be of a substantial amplitude. Thus in practice charge curves more nearly like those shown in Figure 2*b* are realized. These curves have a positive slope on the charge and discharge portions rather than the vertical portions shown by Figure 2*a*. Characteristics of this nature, however, make possible partial withdrawal from saturation of the capacitor by simply controlling the amplitude of the output voltage of source 27 so that the time-integral of voltage in the output pulse derived on forward half cycles may be selectively varied between zero and the value obtained when the capacitor is completely withdrawn from saturation. For example, assume that the voltage output of source 27 was set at voltage $V_x$ intermediate the voltage $V_1$, the maximum voltage for source 27 that can be tolerated without causing reset and the voltage $V_3$, the minimum control source 27 voltage required to produce full reset. Under this set of conditions, source 1 will withdraw capacitor 5 from saturation during the reset half cycle shown as period $t_9$ in Figure 4 until the voltage across capacitor 5 is equal to the output of clamping source 27. Thereafter, current will flow through source 27, rectifier 11 and resistor 9, and the capacitor 5 would be withdrawn no further from saturation. The charge on capacitor 5 will remain at the level reached when the voltage thereon equalled the output of clamping source 27. On the next forward half cycle of the supply voltage, as shown in Figure 4 at time $t_{10}$, a voltage pulse will appear across load 3, the time-integral of voltage of which will be proportional to the extent to which capacitor 5 was withdrawn from saturation. Thus by adjusting the voltage level of source 27 anywhere between voltage levels $V_1$ and $V_3$ varying amounts of power can be delivered to the load 3.

Inasmuch as complete withdrawal from saturation is not instantaneous but requires a finite amount of time (nearly equal to a half cycle in the instant example), partial withdrawal from saturation also may be accomplished by applying to terminals 23 and 25 for a predetermined portion of the reset half cycle the full incremental voltage ($V_3$—$V_1$) required to completely withdraw capacitor 5 from saturation. Partial withdrawal in this manner may be obtained by applying to the terminals a voltage pulse of fixed amplitude and variable duration that is synchronized with the beginning of the given reset half cycle or with the beginning of immediately preceding forward half cycle. The pulse is set to terminate as soon as the desired charge level is reached. The charge level remains constant for the reason that if during reset the capacitor is brought to point G on the charge curve of Figure 2*b*, the charge level for the instant reset half cycle will remain unaffected though the voltage of source 27 reduces to a voltage equal to the value $V_1$ supplied by battery 13. Thus once the desired charge level is reached, the control voltage 27 is reduced to such an extent that current flows through source 27 and rectifier 11 preventing further charging of capacitor 5.

Referring to Figure 5, there is shown a block diagram of a pulse generator for applying voltage pulses to terminals 23 and 25 when it is desired to operate the amplifier of Figure 1 in the manner described immediately above. Terminals 19 and 21 are coupled to a squaring and peaking circuit 401 such as that shown in "Radio Electronics Fundamentals," U. S. Navy Publication NavShips 900,016 (1944) at page 171. The output of circuit 401 is applied to the input of a one-shot multivibrator 403 such as that shown in "Radio Electronics Fundamentals," supra, Figure 211, page 194, having a normally nonconducting input tube and a normally conducting output tube **404*b*. The input signal from circuit 401 is applied to the grid of the normally non-conducting input tube. Since the time-base of such a one-shot multivibrator may be controlled by varying the grid-leak resistance 405 of the output tube, a handwheel, or if remote control is desired, a servo-motor or other control device 409 may be coupled by a mechanical linkage to resistance 405 to control the duration of each square-wave pulse therefrom. The output of the multivibrator is coupled to terminals 25 and 23 (Figure 1) in a manner such that the voltage pulses appearing therebetween are of positive polarity at terminal 25 relative to terminal 23**.

The operation of the pulse generator of Figure 5 is as follows. At the beginning of each forward half cycle of the voltage output of supply source 1, squaring and peaking circuit 401 will generate a very short-duration spiked pulse. This pulse is applied to the input of one-shot multivibrator 403 to generate a square-wave having a time-base that is variable in accordance with control device 409. The square-wave thus may extend in time from the beginning of a forward half cycle to any desired instant in the immediately following reset half cycle.

In Figure 3 there is shown another embodiment of my invention for use under circumstances requiring a full wave output voltage waveform. In this embodiment, two serially-connected saturable, non-linear capacitors 201 and 203 having the same rectangular loop characteristics as capacitor 5, are coupled across a split-phase alternating voltage supply source 205 by means of current limiting resistances 207 and 209. The alternating voltage supply source 205 may comprise an alternating voltage generator 211 similar to a generator 1 of Figure 1, connected to the primary of a transformer 213 having a center-tapped secondary. Load 215, which, as previously mentioned is typically a piezoelectric crystal or other similar high impedance, low current device, is connected between juncture 217 of capacitors 201 and 203 and the center-tap 213*c* of the secondary of transformer 213. Resistance 207 connects the terminal 219 of capacitor 201 to one output terminal 213*a* of transformer 213; resistance 209 connects the terminal 221 of capacitor 203 to the other terminal 213*b* of transformer 213. The values of resistances 207 and 209 are chosen so that, with the circuit connected as described to this point, the split-phase supply source 205 drives the capacitors 201 and 203 from knee to knee of their respective charge loops, in opposed alternation, but does not drive the capacitors into the saturation region (i. e., from point C to point E and return, Figure 2*a*). For the purposes of description, both capacitors 201 and 203 will be termed positively saturated when the plates away from the load or terminal 217 are positively charged to saturation.

Selective withdrawal of the capacitors from saturation is accomplished by means of a circuit somewhat different from the simple clamping circuit of Figure 1. Batteries or other direct voltage sources 223 and 225 are coupled to the capacitor terminals 219 and 221 respectively by means of halfwave rectifiers 227 and 229. A balanced control voltage source 231 having an electrical neutral 233 is connected to batteries 223 and 225, with the neutral terminal 233 connected to the juncture 217 of capacitors 201 and 203. Rectifiers 227 and 229 are polarized to prevent current flow from neutral terminal 233 to terminals 219 and 221, respectively. The positive terminal of batteries 223 and 225 are respectively connected to halfwave rectifiers 227 and 229 with the negative terminals thereof respectively connected to output terminals 235 and 237 of control voltage source 231.

The function of battery 223, which has a voltage at least equal to the minimum voltage level $V_4$ required to raise capacitor 201 to saturation, is to provide a blocking voltage across rectifier 227 to permit supply source 205 to withdraw capacitor 201 from negative saturation when terminal 213*a* is positive with respect to terminal 213*b* and when there is no voltage output from source 231 between terminals 235 and 233. Battery 225 performs a similar function as regards capacitor 203 when there is no voltage output from source 231 between terminals 237 and 233. Control voltage source 231 is operative to provide incremental voltages, conveniently square-wave voltages, that buck batteries 223 and 225 and so tend to nullify their blocking action and therefore to prevent withdrawal from negative saturation of capacitors 201 and 203. These individual circuits including the rectifiers will be termed control circuits for the capacitors across which they are connected in shunt.

Source 231 may comprise a pulse transformer 241 having a center-tapped secondary, a potentiometer 243 and a square-wave generator synchronized with source 205, such as the multivibrator shown at page 209 of "Radar Electronics Fundamentals," U. S. Navy Publication NavShips 900,016 (1944). The output of source 245 is coupled across the outer terminals of potentiometer 243, and the primary of transformer 241 is connected between the tap 247 and one terminal of a handwheel or by means of a mechanical linkage coupled to servo-motor 249 if remote control is desired. One of the output terminals of transformer 241 is connected to terminal 235, the other output terminal is connected to terminal 237, and the center-tap thereof is connected to terminal 233. The frequency of source 245 is the same as that of source 211 and is in phase opposition thereto so that terminal 213*a* is positive when terminal 235 is negative with respect to the center-taps of the transformer secondary windings. A waveform representation of the square-wave voltage between terminals 235 and 233 is shown in Figure 6*c*, along with the alternating voltage between terminals 213*a* and 213*c* (in Figure 6*a*) and the output voltage across load 215 (Figure 6*b*).

The operation of the embodiment of Figure 3 is as follows. Let it first be assumed that tap 247 is positioned at the lower end of potentiometer 243 so that no control voltage appears between terminals 235 and 237. The output voltages of batteries 223 and 225 are greater than the voltage required to drive capacitors 201 and 203 respectively from one sense of saturation to the other. Referring to Fig. 2*b*, the required battery voltage would be equal to $V_4$. When these voltage conditions exist, the control circuits for each capacitor can exert no effect on the voltages imposed across the condensers by supply source 205 and are effectively open circuits until after the capacitors have been driven completely from saturation in one sense to saturation in the opposite sense. As mentioned above, resistors 207 and 209 limit current flow so that capacitors 201 and 203 are driven during a half cycle only from knee to knee of their respective charge loops, which knee points are shown as E′ and C′ in Figure 2*b*; therefore no current can flow through the control circuits when there is no output from source 231. Under this condition of operation, supply source 205 alternately drives capacitors 201 and 203 between saturation in one sense and saturation in the opposite sense. The combined impedance of resistor 207 and capacitor 201 is equal to the combined impedance of capacitor 203 and resistance 209, so no voltage appears across load impedance 215. Reference to the first half cycle of the curves of Figure 6 show the voltage conditions existing during the above described period. Although only one half cycle $C_1$ is shown, the load voltage shown in Figure 6 and the variable control voltage shown in Figure 6*c* will remain at 0 regardless of the alternations of the source voltage 205 shown in Figure 6*a*.

Let it now be assumed that at the end of a half cycle $C_1$ (see Figure 6*a*) of source 205 (with capacitor 201 charged to point H′ and capacitor 203 charged to point H′), tap 247 is positioned on potentiometer 243 so that the amplitude of the square-wave voltage appearing between output terminals 235 or 237 and the center-tap terminal 233 (as shown in Figure 6*c*) clamps the voltages appearing across capacitor 201 and 203 at values equal or less than levels designated $V_5$ in Figure 2*b*. Let it further be assumed that at the end of a half cycle $C_1$ terminal 213*a* is zero going positive with respect to terminal 213*b*. During the next half cycle $C_2$, the combined voltage of battery 223 and the voltage between terminals 235 and 233 will permit conduction in rectifier 227 and clamp the voltage appearing across capacitor 201 from source 205 at a value equal to $V_5$ or below to thereby prevent capacitor 201 from being withdrawn from negative saturation, to which it was driven on the preceding half cycle. Current will flow through the upper control circuit comprising rectifier 227, battery 223, the upper half of source 231 to junction 217. During this half cycle capacitor 203 is driven to saturation in a sense opposite to that which it was driven during half cycle $C_1$. Under conditions existing when no current is flowing in the control loops including the rectifiers and batteries, there will be no current flowing through the load 215 since the potential of point 217 and terminal 213*c* will be identical because of the balanced loads. Any unbalance in the loads in the upper or lower loops will result in current flow through load 215. Thus any difference in impedance between capacitor 203 and the combined impedance of rectifier 227, battery 223 and the upper half of source 231 between terminals 235 and 233 will cause current to flow through load 215 and will produce a voltage pulse thereacross, but by careful circuit design this current flow can be made so small as to be negligible. At the end of cycle $C_2$, capacitor 201 is still charged to negative saturation and capacitor 203 has become charged to negative saturation.

During the next half cycle $C_3$, the combined voltage of battery 225 and of the lower half of source 231 (i. e., between terminals 233 and 237) will clamp the voltage across capacitor 203 so as to prevent withdrawal from negative saturation thereof. At the beginning of cycle $C_3$, the position of capacitor 203 on the charge curve of Figure 2*b* may be represented by point H′ at negative saturation. As terminal 213*b* becomes positive relative to 213*a*, supply 205 tends to reverse the charge on capacitor 203. When the current flow through the loop including both capacitors and resistances 207 and 209 increases the voltage across capacitor 203 to $V_5$, as shown in Figure 2*b*, the blocking action of battery 225 is overcome and current flows through the rectifier 229 in the lower control loop. This current prevents capacitor 203 from being withdrawn from negative saturation. Thus during cycle $C_3$, the capacitor 203 moves from H′ to F′ and back to H′ on the charge curve. It can be easily seen that the current through rectifier 229 and the lower control loop can flow only through the load 215. The reason for this is that rectifier 227 is opposed to current flow in that direction in the upper control loop and capacitor 201, already being saturated in the sense to which this current flow would tend to drive it presents the appearance of an open circuit in that leg of the circuit. Therefore the current must flow through load 215 and will produce a voltage pulse thereacross as shown in Figure 6*b*.

On the next half cycle $C_4$ and on alternate half cycles thereafter, a voltage pulse of the same polarity will similarly be produced across load 215 by current flow through rectifier 227, battery 223 and the upper half of source 231. In the last described conditions of control voltage, the operation and output produced resembles closely a full wave rectifier. Once the capacitors have become negatively saturated, they are maintained in such condition by the control voltage applied. Referring to Figure 2*b*, it can be seen that both capacitors are operating between points E′ and F′ on the charge loop.

The slight notches 250 in the output curve of Figure 6*b* for the cycles $C_3$ to $C_8$ indicate a deviation from a normal full rectification curve. These notches 250 indicate an absence of load current until the supply voltage exceeds the blocking value of the control circuits; the balanced circuit with both capacitors at saturation prevents current flow in the load during that period.

If the amplitude of the square-wave pulses across terminals 235, 237 is reduced to an intermediate value such that the capacitors 201, 203 are driven, in the manner described above, to a charge level intermediate the saturation levels, voltages pulses having proportionately smaller time-integrals of voltage will appear across load 215. For example, assume that at the beginning of a given half cycle $C_{15}$ tap 247 has been positioned so that the amplitude of the square-wave pulses are reduced by half, as shown in Figure 6*c*, and that during this half cycle capacitor 203 has been driven to an intermediate level on the charge loop as for instance point J′ in Figure 2*b*. On the following half cycle $C_{16}$ current will flow through capacitor 201 until it is clamped at the intermediate charge level $V_6$, and will thereafter flow through rectifier 227, battery 223 and the upper half of source 231. The current will flow to capacitor 203 until it is driven to negative saturation, and will thereafter flow through load 215 since on becoming saturated capacitor 203 will appear as an open circuit. During the two half cycles $C_{15}$ and $C_{16}$, capacitor 203 will be charged to point J′ and then to point E′ or negative saturation. No current flow takes place in the load until after capacitor 203 becomes saturated because of the balanced circuit comprising the capacitors and resistances 207 and 209. On the next half cycle $C_{17}$ current will similarly flow through capacitor 203 until the voltage thereacross is clamped at the value $V_6$ indicated in Figure 2*b*, and thereafter follows the path including rectifier 229, battery 225 and the lower half of source 231 to drive capacitor 203 to saturation. After capacitor 203 is saturated, the current will pass through load 215 to produce a voltage pulse thereacross.

From the above it can be seen that the same current flows through control source 231 as through load 215. The voltage output required across the terminals of source 231 can be made very small by carefully selecting capacitors having charge vs. applied voltage characteristics closely approaching the rectangular ideal, while the voltage pulse across load 215 can be made quite large. This relationship between control voltage and supply voltage is pointed up by reference back to the control voltage necessary for complete power transfer to the loads as explained relative to cycles $C_3$ through $C_8$ above. Thus a control voltage of $V_4$—$V_5$ was necessary for the voltage vs. charge curve shown in Figure 2*b*. An increasing of the slope between F′ and C′ would lessen the required control voltage.

Very high power amplification is possible since almost no power is taken from the control source 231. The absolute power limitations are imposed by the breakdown voltages of the capacitors and rectifiers and the current ratings of the rectifiers.

For maximum power transfer from source 205 to load 215, resistances 207, 209 and load 215 should be of the same impedance. The impedance of unsaturated capacitors 201 and 203 will generally be negligible compared to that of resistances 207 and 209; the impedances of the alternate current paths through rectifier 227 and through rectifier 229 will be of the same order of magnitude as that of the capacitors. For maximum power transfer the impedance of a load must equal the impedance of the source coupled thereto; therefore it is obvious that the impedance of load 215 must equal that of resistances 207 and 209, inasmuch as the impedance of the resistances are alternately the impedance of the source insofar as the load is concerned.

If the frequency of the supply source is low, and the ambient temperature in which the amplifier is to operate is reasonably low, it will generally be possible to keep the operating temperature of the non-linear capacitors below the Curie point without having to resort to a temperature regulating device. However, at high supply frequencies, the power absorbed by the capacitors over a given period of time will become so great as to drive the operating temperature thereof above the Curie point. Under this circumstance, it will be necessary to resort to a temperature compensated enclosure for the capacitors such as a refrigerated or water-cooled compartment in order to keep the temperature of the capacitors below the Curie point. Inasmuch as the Curie point of a capacitor having a dielectric composed entirely of barium titanate is much higher than that of dielectric composed of strontium titanate or mixtures of the two titanates, the use of barium titanate alone as a dielectric is preferable in applications where high operating temperatures may prevail.

The voltage and power gain obtainable from the amplifier is determined by the ratio of the breakdown voltage of the dielectric used to the half-width of the charge loop. Therefore it is desirable to utilize dielectric material having minimum half-width voltage and maximum breakdown voltage.

Thus it can be seen that my invention provides a dielectric amplifier capable of very high power gain in a single stage, having a response time of one half cycle at the frequency of the power and voltage supply source coupled thereto. The amplifier is adapted to provide the same power amplification for signals having the same frequency as the supply source as for signals having a a frequency which is a small fraction of the supply frequency.

Although the embodiments disclosed in the preceding specification are preferred, other modifications will be apparent to those skilled in the art which do not depart from the scope of the broadest aspects of the present invention.

What is claimed is:

A dielectric amplifier comprising a pair of nonlinear capacitors possessing rectangular loop charge saturation characteristics, a load impedance, a split phase alternating voltage supply having an electrical neutral point, a pair of unidirectional elements, and a clamping control voltage supply having an electrical neutral point; said capacitors connected in series across said split phase source, said load being connected between the junction point of said capacitors and the electrical neutral point of said split phase source and the neutral point of said clamping control voltage source, one of said unidirectional elements connected between one end of said split phase source and one end of said clamping control voltage source, the other of said unidirectional elements connected between the other end of said split phase source and the other end of said clamping control voltage source, said unidirectional elements polarized so as to permit current to flow into the clamping control voltage source.

References Cited in the file of this patent

UNITED STATES PATENTS

| | | |
|---|---|---|
| 2,191,315 | Guanella | Feb. 20, 1940 |
| 2,265,290 | Knick | Dec. 9, 1941 |
| 2,470,893 | Hepp | May 24, 1949 |
| 2,696,530 | Kerns | Dec. 7, 1954 |
| 2,728,858 | Ziffer | Dec. 27, 1955 |
| 2,750,454 | Melville | June 12, 1956 |

OTHER REFERENCES

Publication "Dielectric Amplifier Fundamentals" by D. M. Vincent, Electronics, December 1951, pages 84–88.